United States Patent [19]
Lüscher et al.

[11] 3,932,773
[45] Jan. 13, 1976

[54] CONTROL SYSTEM FOR PERIODICALLY ENERGIZING A CAPACITIVE LOAD

[76] Inventors: Jakob Lüscher, 20b, route de Drize, 1227 Carouge, Geneva; Andre Rusznyak, 28, avenue Pierre-Odier, 1208 Geneva, both of Switzerland

[22] Filed: July 20, 1973

[21] Appl. No.: 380,971

[30] Foreign Application Priority Data
July 21, 1972 Switzerland.................... 010985/72
July 11, 1973 Switzerland...................... 10086/73

[52] U.S. Cl. ................. 307/270; 307/246; 307/265; 307/269
[51] Int. Cl.² .. H03K 1/18; H03K 4/58; H03K 5/04; H03K 17/60
[58] Field of Search ........... 307/205, 214, 251, 246, 307/265, 267, 270, 225 R, 225 C, 269

[56] References Cited
UNITED STATES PATENTS

| | | | |
|---|---|---|---|
| 3,629,618 | 12/1971 | Fujimoto........................ | 307/251 X |
| 3,660,684 | 5/1972 | Padgett et al................. | 307/251 X |
| 3,735,277 | 5/1973 | Wanlass......................... | 307/251 X |
| 3,774,055 | 11/1973 | Bapat............................. | 307/251 X |
| R27,305 | 3/1972 | Polkinghorn et al. .......... | 307/279 X |

*Primary Examiner*—John S. Heyman
*Assistant Examiner*—L. N. Anagnos
*Attorney, Agent, or Firm*—Karl F. Ross; Herbert Dubno

[57] ABSTRACT

Two pairs of serially connected insulated-gate field-effect transistors (IGFETs) are bridged in parallel across a d-c supply, the junction of the drain and source electrodes of the first pair of IGFETs being tied to the gate of one of the IGFETs of the second pair whose junction is connected to a capacitive load circuit to be periodically energized under the control of at least one train of trigger pulses of low duty ratio applied to the gate of at least one of the IGFETs of the first pair. The gates of the IGFETs of the second pair are alternately triggered through the intermediary of a further IGFET, or pair of serially interconnected IGFETs, controlling the other IGFET of the second pair. The input capacitances of these latter IGFETs are small compared with that of the load, and their transconductance is low with reference to the load capacitance whereby the rise and fall of the load voltage at the junction of the second IGFET pair outlasts the duration of a trigger pulse; this feature is utilized in some embodiments to make the same train of trigger pulses alternately effective to switch conduction between the second pair of IGFETs.

10 Claims, 10 Drawing Figures

3,932,773

CONTROL SYSTEM FOR PERIODICALLY ENERGIZING A CAPACITIVE LOAD

FIELD OF THE INVENTION

Our present invention relates to an electronic control system serving for the periodic energization of a capacitive load with a recurrent sustained binary signal under the control of trigger pulses which are substantially shorter than that signal.

BACKGROUND OF THE INVENTION

Control systems are known in which a load is driven by a set of field-effect transducers of the insulated-gate type (IGFET) which are connected in a so-called bootstrap circuit. Thus, a capacitor is inserted between the gate and a main electrode (source) of an IGFET to feed back changes in the output voltage to its input; this requires, of course, that the input impedance of the load connected to the source be high enough to cause a significant instantaneous change of the IGFET output voltage in response to a corresponding input signal. As a result, the output voltage applied to the load follows closely the input signal (or combination of input signals) delivered to the driving IGFET so that a system of this character is incapable of performing a switching function changing the load voltage for a prolonged period in response to a short trigger pulse.

OBJECTS OF THE INVENTION

The principle object of our invention, therefore, is to provide a system of the general type set forth, adapted to be realized with integrated circuitry, which enables such switching to be performed on a load with low input impedance, specifically a substantially purely capacitive load circuit.

Another object is to provide means in such a system for minimizing the expenditure of electrical energy in the operation thereof.

SUMMARY OF THE INVENTION

A control system according to our invention comprises a generator or periodic trigger pulses whose duration is a small fraction of their repetition period (i.e., which have a low duty ratio) and also of the length of the output signals to be produced. A set of IGFETs are connected between the pulse generator and the capacitive load to be energized by these output signals, this set including two pairs of transistors with main electrodes (source and drain) serially connected across the poles of a direct-current supply. One transistor of the first pair has its gate connected to the pulse generator for periodic triggering and has one of its main electrodes, i.e., its drain, connected to the same pole of the supply as the corresponding electrode of one transistor of the second pair, the latter transistor having its gate connected to the junction of the first transistor pair whereas the junction of the second pair is connected to the load. Additional circuitry, which may include one or two further IGFETs, is connected to the gates of the other transistors of these pairs for making same conductive between periods of conduction of the triggered transistor of the first pair, thereby periodically changing the potential of the second junction between a lower and a higher voltage level as the gate of the corresponding transistor of the second pair follows the voltage changes of the first junction. The input capacitance of the last-mentioned transistor, effective between its gate and the second junction tied to the load, is small compared to the load capacitance whereby the potential of the second junction changes substantially more slowly than that of the first junction.

Advantageously, pursuant to another feature of our invention, each transistor of the second pair in its conductive state forms with the load a network whose time constant is long enough to make the transition of the load voltage between its lower and higher levels outlast the duration of the trigger pulses. This time constant, of course, is determined by the product of the load capacitance and the resistance of the conducting transistor, this resistance being reciprocally related to its transconductance which therefore should be relatively low. In such a system it is possible, according to still another feature of the invention, to make successive trigger pulses of the same pulse train effective to switch to load voltage alternatively to its higher and its lower level by connecting the aforementioned further IGFET with its main electrodes between the second junction and a third junction formed by the interconnected gates of the other transistors of the first and second pairs, i.e., those transistors which have main electrodes (sources) tied to the other pole of the supply.

In accordance with a feature of our invention, the additional circuitry for the triggering of the other transistors of the first and second pairs includes a third pair of IGFETs connected across the supply and forming a third junction therebetween, the gates of the transistors of the first and third pairs being connected to the pulse generator for triggering in an invariable order whereas the gate of the other transistor of the second pair (i.e., the IGFET whose gate is not connected to the first junction) is connected to the third junction. The trigger pulses in this case may form four interleaved pulse trains, for individually energizing the gates of the four transistors of the first and third pairs, or two interleaved pulse trains for jointly energizing two transistors at a time, one from each of these pairs.

BRIEF DESCRIPTION OF THE DRAWING

The above and other features of our invention will now be described in detail with reference to the accompanying drawing in which.

SPECIFIC DESCRIPTION

Figure 1:
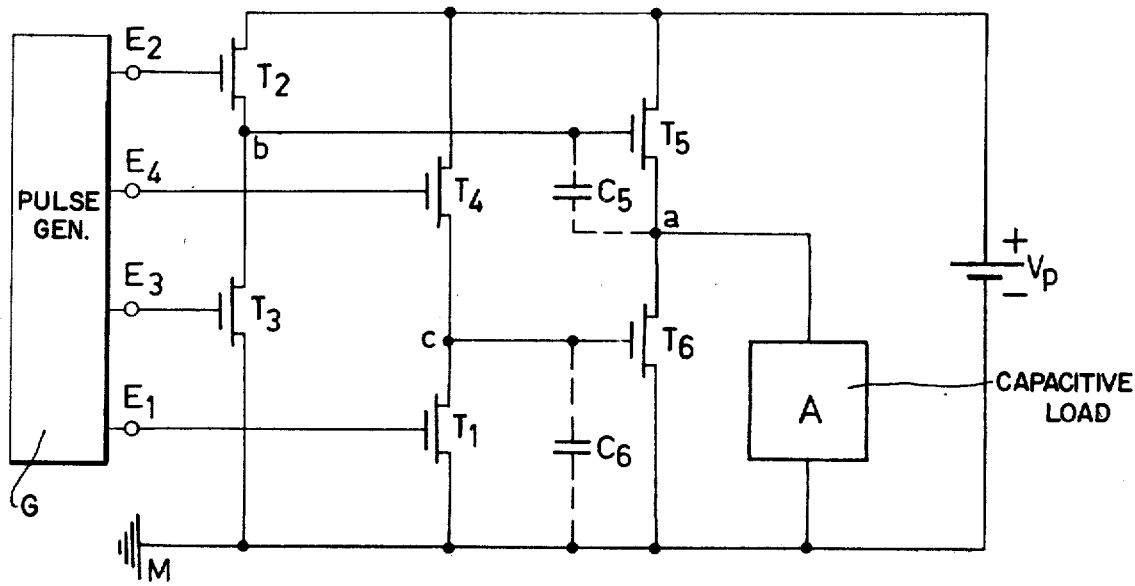
FIG. 1 is a circuit diagram of a first embodiment of our improved control system.

The system shown in FIG. 1 is designed to form periodic signals for the energization of a capacitive load circuit A under the control of four interleaved trigger-pulse trains $i_1$ to $i_4$ of the same frequency and low duty ratio (FIG. 2) delivered by a pulse generator G with output terminals $E_1$-$E_4$.

It comprises six field-effect transistors, $T_1$ to $T_6$, of the insulated-gate type (IGFET), connected together in the manner described below.

The transistors are divided into three series-connected pairs $T_2$ and $T_3$, $T_1$ and $T_4$, and $T_5$ and $T_6$ connected in parallel across a supply of d.c. voltage $V_p$, shown as a battery, whose negative pole is grounded at M. The transistors are all of N-channel type with a P-type crystal body.

Figure 2:
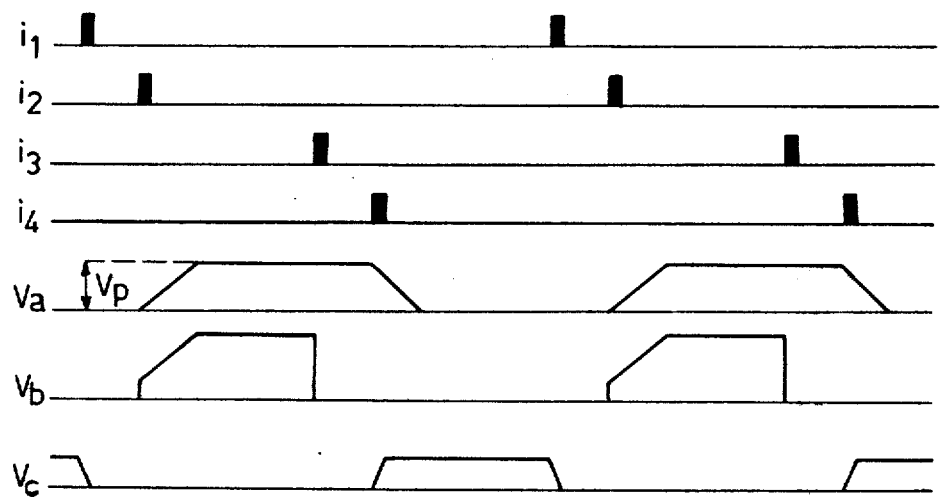
FIG. 2 is a set of graphs relating to the operation of the system of FIG. 1.

The gates of the transistors $T_1$, $T_2$, $T_3$ and $T_4$ are connected to terminals $E_1$ to $E_4$, each receiving one of the aforementioned pulse trains $i_1$ to $i_4$ shown in FIG. 2. More particularly the terminal $E_1$ receives series $i_1$, terminal $E_2$ receives series $i_2$, the terminal $E_3$ receives series $i_3$ and the terminal $E_4$ receives series $i_4$.

The gates of the transistors $T_5$ and $T_6$ are respectively connected to the junction point b of the main electrodes (source and drain) of the transistors $T_2$ and $T_3$ and, to a similar junction point c of the transistors $T_4$ and $T_1$. The junction point a of the transistors $T_5$ and $T_6$ constitutes the output terminal of the system, one of the inputs of the load circuit A being connected to this terminal while the other input thereof is connected to ground M.

The transistor $T_5$ is so dimensioned that the capacitance $C_5$ between its gate and its source to which the load circuit A is connected (point a) is much less than the input capacitance of this load circuit e.g. 10 times less.

Furthermore, if it is desired that the rise and fall of the output $V_2$ signal on the terminal a take place slowly with moderately inclined pulse flanks, as seen in FIG. 2, the ratio of the transconductance of the transistor $T_5$ to the capacitance of the circuit A as well as that of the transconductance of the transistor $T_6$ to the capacitance of the circuit A should be small.

Moreover all the transistors have narrow channels so as to present a low input capacitance. In the case of transistors $T_5$ and $T_6$, this capacitance is represented, in broken line, by virtual capacitors $C_5$ and $C_6$.

In describing the operation of the system of FIG. 1, we will assume that, before the arrival of the first pulse of series $i_1$ at the terminal $E_1$, the capacitance $C_6$ is charged and that therefore the transistor $T_6$ is open and the capacitance of the circuit A is discharged, the point a being grounded.

The first pulse of the series $i_1$ unblocks the transistor $T_1$ so that the capacitance $C_6$ discharges across it; the transistor $T_6$ is blocked.

Thereupon, since the capacitance of circuit A is much higher than the input capacitance $C_5$ of the transistor $T_5$, the major part of the supply voltage from the battery $V_p$ will appear across the terminals of this virtual capacitor when transistor $T_2$ receives a trigger pulse $i_2$. From this moment on, the transistor $T_5$ conducts and remains conductive so that the current passing through this transistor charges the capacitance of the circuit A and the voltage increases at point a up to the value of the battery voltage $V_p$ as indicated at $V_a$ in FIG. 2. Simultaneously voltage $V_b$ rises to a value exceeding that of voltage $V_a$ since the electric charge of the capacitance $C_5$ is preserved.

As the ratio of the transconductive of the transistor $T_5$ to the capacitance of the circuit A is small, this increase in load voltage is relatively slow, which is desirable when the frequency of the control signal for circuit A is relatively low, particularly when the load is of the so-called "capacitor pull-up circuit" type (see for instance Robert H. Crawford and Bernard Bazin: "Theory and Design of MOS Capacitor Pull-Up Circuits, IEEE. Journal of Solid-State Circuits, Vol. SC-4, No. 3, June 1969 ). From FIG. 2 it will be noted that the duration of any trigger pulse $i_1 - i_4$ is substantially less than that of the rise or fall of load voltage $V_a$.

When the first pulse of the series $i_3$ arrives at the input $E_3$ of the system, the transistor $T_3$ conducts so that the potential $V_b$ of the point b becomes 0. The source of the transistor $T_5$ will then have a positive potential with respect to its gate and this transistor is therefore blocked.

If the load constituted by the circuit A is purely capacitive, the voltage at point a remains substantially at the supply level $V_p$ until the arrival of a pulse $i_4$ at the input $E_4$. This pulse unblocks the transistor $T_4$ whereby the input capacitance $C_6$ of the transistor $T_6$ is charged and this transistor conducts since it is energized by the voltage of the battery $V_p$ across the transistor $T_4$. Thus, the capacitance of the circuit A is discharged through transistor $T_6$ at a relatively slow rate since the transconductance of the transistor $T_6$ is low with reference to the capacitance of load A. The capacitance $C_6$ remains charged until the arrival of the following pulse $i_1$ which causes the discharge thereof (see curve $V_C$, FIG. 2) whereupon, the cycle described can start all over again.

From FIG. 2 it will be noted that the voltage $V_b$ on the first junction b, netween IGFETs $T_2$ and $T_3$, changes more slowly than the voltage $V_a$ of the second junction a, between IGFETS $T_5$ and $T_6$. This is due, of course, to the fact that capacitance $C_5$ is substantially lower than the capacitance of load circuit A which greatly attenuates the steep flanks of signal $V_b$ in their transmission from point b to point a.

Alternatively the source of the transistor $T_3$ could be connected to the junction point a than to ground M as shown in FIG. 1. In such case, it will be necessary that the peak gate voltage of the transistor $T_3$ exceed the voltage of the battery $V_p$ sufficiently for enabling the input capacitances of the transistor $T_5$ to be discharged. On the other hand, the polarity of the charge on this input capacitance will never be reversed in that instance.

Figure 3:
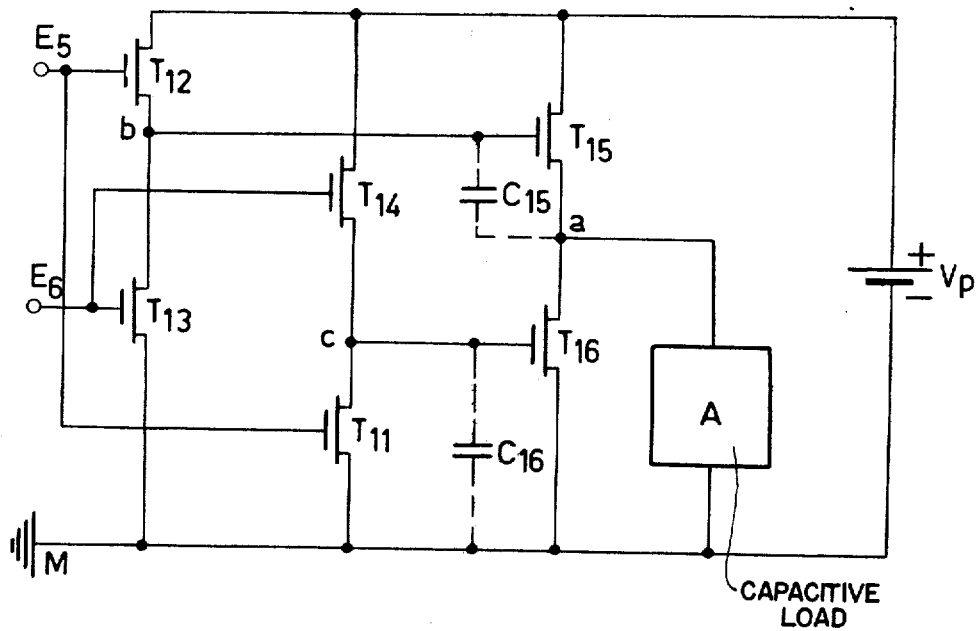
FIG. 3 is a circuit diagram of a second embodiment.
Figure 4:
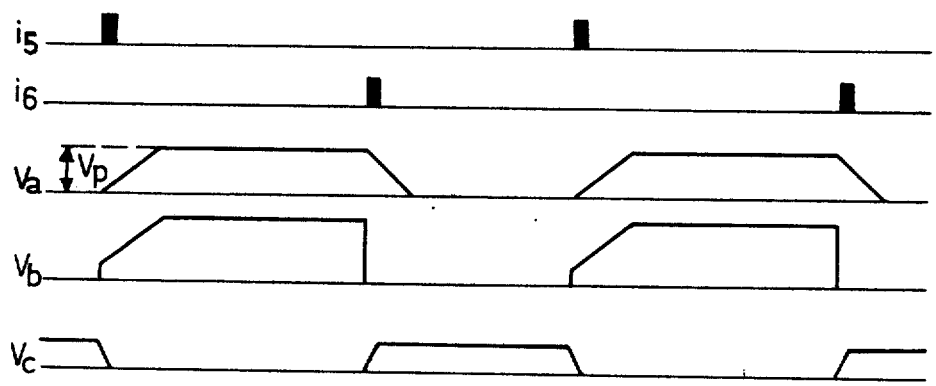
FIG. 4 is a set of graphs relating to the operation of the system of FIG. 3.

In FIG. 3 we have shown a system designed to form periodic control signals for a capacitive load circuit A from two relatively offset trains of trigger pulses $i_5$ and $i_6$ of the same frequency (see FIG. 4).

This system comprises six IGFETs, $T_{11}$ to $T_{16}$, connected in pairs in the same manner as the transistors $T_1$ to $T_6$ of the embodiment shown in FIG. 1. However, the system shown in FIG. 3 has only two inputs $E_5$ and $E_6$, the first input $E_5$ receiving the pulse train $i_5$ while the second input recieves the pulse train $i_6$. The transistors $T_{11}$ and $T_{12}$, on the one hand, and $T_{13}$ and $T_{14}$, on the other hand, have their gates connected in parallel to the input terminals $E_5$ and $E_6$, respectively.

The capacitance $C_{15}$ between the gate of the transistor $T_{15}$ and its source forming a junction a with the drain of transistor $T_{16}$, is again considerably smaller than the capacitance of the load circuit A. Furthermore, the transconductance of the transistors $T_{15}$ and $T_{16}$ is again so small that the signal voltage $V_a$ rises and falls slowly at the point a.

The operation of the system of FIG. 3 is as follows:

Let us assume first that the input capacitance $C_{16}$ of the transistor $T_{16}$ is charged and that, therefore, this transistor conducts; the voltage at point $a$ is zero.

When the first pulse of series $i_5$ arrives at the input terminal $E_5$, it causes the simultaneous conduction of the transistors $T_{11}$ and $T_{12}$. As a result, on the one hand, the capacitance $C_{16}$ discharges to cut off the transistor $T_{16}$ and, on the other hand, the potential $V_b$ (FIG. 4) at the point $b$ increases to a value at most equal to that of the voltage of the battery $V_p$. Since the capacitance of the load circuit A is much higher than the input capacitance $C_{15}$ of transistor $T_{15}$, the major part of the supply voltage $V_p$ will be present across the terminals of capacitance $C_{15}$ when the transistor $T_{12}$ is unblocked by the pulse from $i_5$. Transistor $T_{15}$ now conducts and remains conductive until the arrival of the first pulse $i_6$ at the input $E_6$; the variation of the potential $V_a$ at point $a$ can be noted from FIG. 4.

When a trigger pulse of series $i_6$ arrives at the input $E_6$, this pulse brings about simultaneously the conduction of the transistors $T_{13}$ and $T_{14}$. It follows, on the one hand, that the potential at point $b$ becomes zero (curve $V_b$ - FIG. 4) and, on the other hand, that the capacitance $C_{16}$ is charged (curve $V_c$) so that the transistor $T_{16}$ conducts. From this moment, the potential at point $a$ decreases to a value of zero (curve $V_a$), the capacitance of circuit A discharging through the transistor $T_{16}$. It will be noted in this connection that the drops of potential at junction $a$ takes place relatively slowly in view of the small transconductance of the transistor $T_{16}$.

The capacitance $C_{16}$ remains charged, and accordingly the transistor $T_{16}$ remains conductive (curve $V_c$), until the appearance of the following pulse of series $i_5$ at the input $E_5$, whereupon the cycle can start over again.

Figure 5:
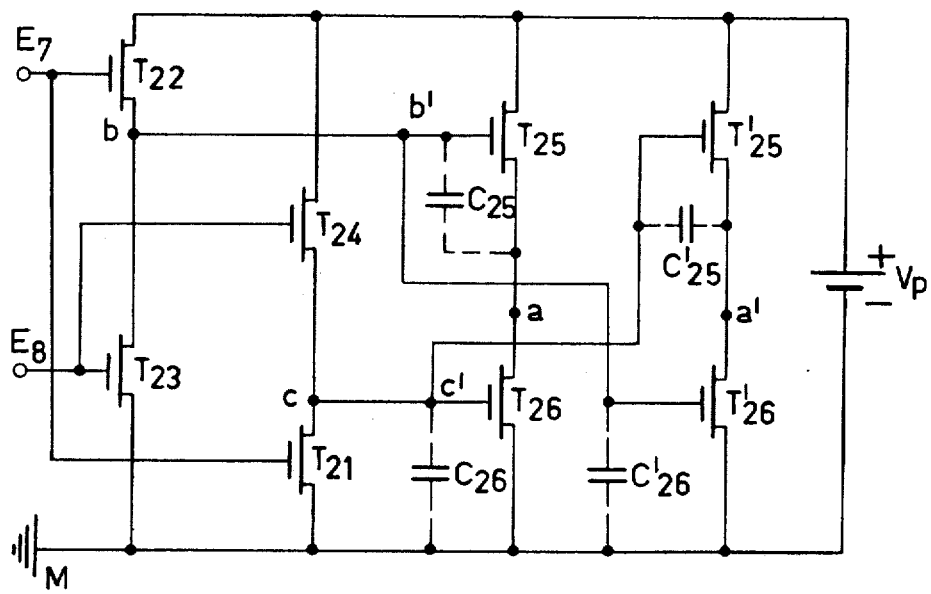
FIG. 5 is a circuit diagram of a modification of the embodiment of FIG. 3.
Figure 6:
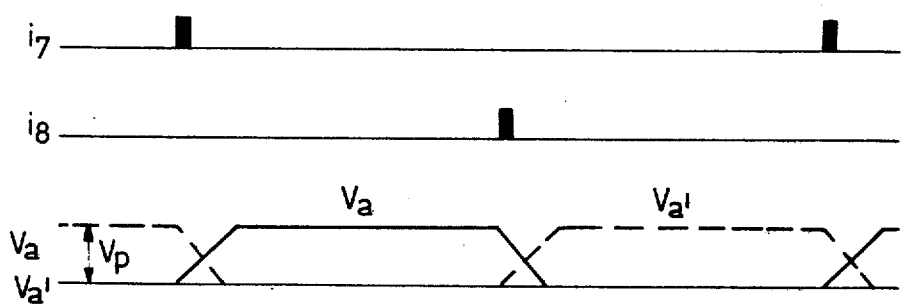
FIG. 6 is a set of graphs relating to the operation of the system of FIG. 5.

FIG. 5 shows a modification of the embodiment FIG. 3, designed to permit balanced energization of a capacitive load circuit (not shown in FIG. 5) by means of two-relatively phase-inverted signals generated at two conjugate points $a$ and $a'$ of the system.

As can be seen, this system differs in substance from the preceding one by the addition of a pair of transistors $T_{25}'$ and $T_{26}'$ which are connected in series across the battery $V_p$). The gate of the first supplemental FET, $T_{25}'$ is connected to the gate of the transistor $T_{26}$ (point $c'$), which is the counterpart of transistor $T_{16}$ in FIG. 3, and the gate of the second FET, $T_{26}'$ is connected to the gate of the transistor $T_{25}$ (point $b'$) which is the counterpart of the transistor $T_{15}$ in FIG. 3.

The capacitances between the gates and the sources (i.e. junction points a and a') transistors $T_{25}$ and $T_{25}'$ are again much smaller than the capacitance of the load circuit connected by its control inputs to the points $a$ and $a'$.

By virtue of the connections described, the capacitances $C_{25}$ and $C_{26}'$, charge concurrently with the capacitances $C_{25}'$ and $C_{26}$, respectively, so that the transistors $T_{25}$ and $T_{25}'$, conduct at the same time as the transistors $T_{26}'$ and $T_{26}$, respectively. It follows that, upon the arrival of any trigger pulse $i_7$ at the input $E_7$ there occurs at the same time at the point a, the appearance of a potential $V_a$,
at the point a', the disappearance of a potential $V_a'$.

Upon the arrival at the input $E_8$ of any trigger pulse $i_8$, which is staggered in time with respect to the pulses of series $i_7$, there occurs at the same time at the point a, the disappearance of the potential $V_a$,
at the point a', the appearance of a potential $V_a'$.

There are thus generated, at $a$ and $a'$, two mutually complementary signals of the same amplitude and frequency.

Figure 7:
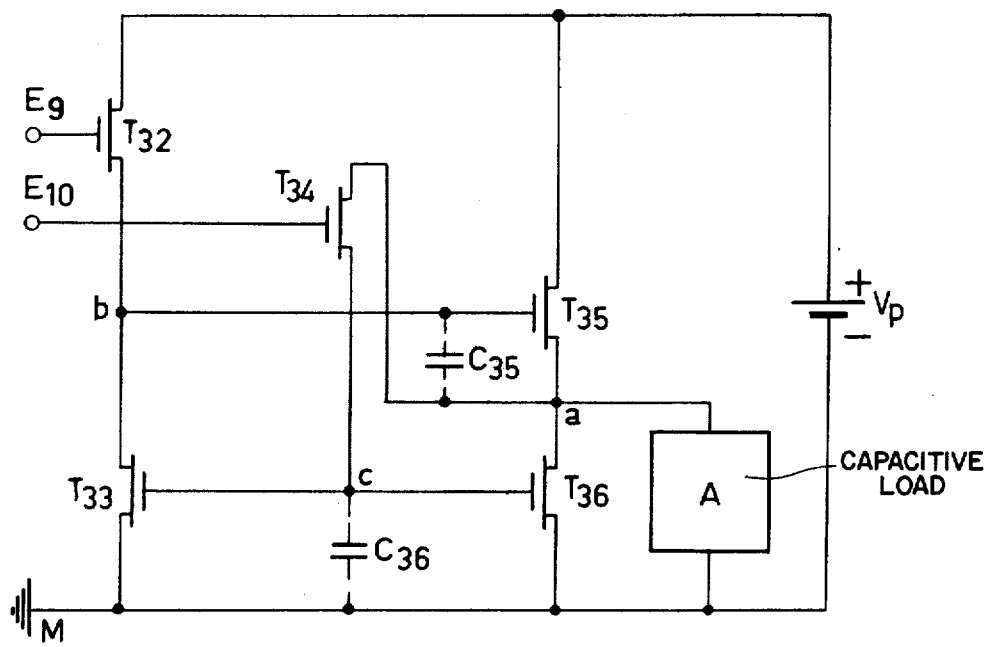
FIG. 7 is a circuit diagram of a third embodiment.
Figure 8:
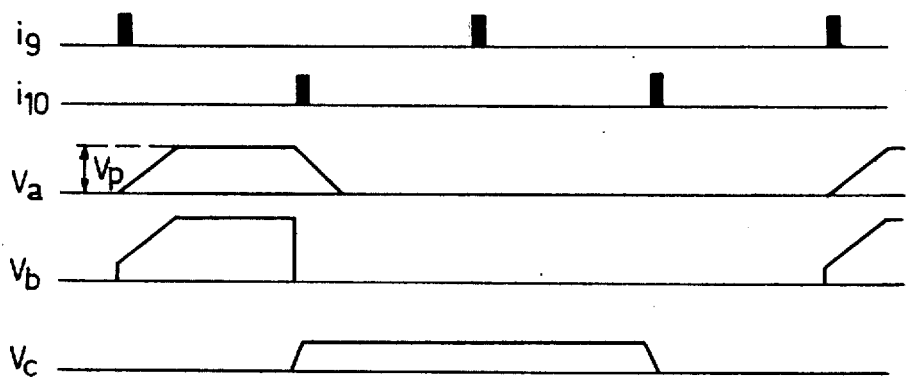
FIG. 8 is a set of graphs relating to the operation of the system of FIG. 7.

The embodiment shown in FIG. 7 is designed to form signals for the energization of the load A from two interleaved series of pulses $i_9$ and $i_{10}$ illustrated in FIG. 8.

This system comprises five IGFETS $T_{32}$, $T_{33}$, $T_{34}$, $T_{35}$ and $T_{36}$ which are connected in the following manner:

The transistors $T_{32}$ and $T_{33}$, on the one hand and $T_{35}$ and $T_{36}$, on the other hand, are serially connected in pairs across a supply battery $V_p$ whose negative terminal is again connected to ground M.

The gate of transistor $T_{32}$ is connected to an input terminal $E_9$ receiving the pulses of the train $i_9$ (FIG. 8). The gate transistor $T_{35}$ is connected to the junction point $b$ of the main (source and drain) electrodes of transistors $T_{32}$ and $T_{33}$.

The gate of the transistor $T_{33}$ is connected to that of the transistor $T_{36}$ via junction c.

The gate of transistor $T_{34}$ is connected, to an input terminal $E_{10}$ receiving the pulses of the train $i_{10}$; its drain is tied to the junction point c while its source is connected to the common junction point $a$ of the transistors $T_{35}$ and $T_{36}$ with the load circuit A whose other input is again connected to ground M.

Here, too the transistor $T_{35}$ in series with the load has a gate 1 source capacitance $C_{35}$ which is substantially smaller than the capacitance of the circuit A. The combined input capacitance of the transistors $T_{36}$ and $T_{33}$, schematically represented by a virtical capacitor $C_{36}$, is also far less than the capacitance of the circuit A.

Furthermore, the transistors $T_{35}$ and $T_{36}$ are of low transconductances

We shall now describe the operation of this system with the assumption that the capacitances $C_{35}$ and $C_{36}$ are discharged when the first pulse of the series $i_9$ arrives at the input terminal $E_9$.

Upon the arrival of this first pulse, the transistor $T_{32}$ conducts and, since the capacitance of the circuit A is much higher than the capacitance $C_{35}$ of the transistor $T_{35}$, it is essentially across the terminals of the latter capacitance that the major part of the voltage of battery $V_p$ appears when the transistor $T_{32}$ receives the pulse of series $i_9$.

As of this moment, the transistor $T_{35}$ conducts and remains conductive so that the voltage $V_a$ rises at the point $a$ up to the value of the voltage $V_p$ (FIG. 8) in the manner already discussed with reference to FIGS. 1, 3 or 5. The capacitance of the circuit A is thereby charged.

Upon the arrival at the input $E_{10}$ of the first pulse of the train $i_{10}$, the transistor $T_{34}$ conducts for a short time so that the capacitance $C_{36}$ is charged through this transistor and by the charge stored in the circuit A without substantial reduction of the voltage at the point $a$ (see curve $V_c$ in FIG. 8). This turns on the transistors $T_{33}$ and $T_{36}$ which causes the dropping to zero of the potential $V_b$ at the point b as well as a relatively slow discharge of the capacitance of the circuit A (curve $V_a$) to zero potential.

The following pulse of series $i_9$, arriving at the gate of the transistor $T_{32}$, causes the transistor to conduct but as the capacitance $C_{36}$ is still charged and as, accordingly, the transistors $T_{33}$ and $T_{36}$ are still conductive, the potential $V_b$ at the point $b$ becomes zero again once the pulse $i_9$ has passed and the potential at the point $a$ remains at zero, the capacitor $C_{35}$ and the load capacitance of the circuit A not being able to charge since the transistor $T_{35}$ remains blocked.

When the following pulse of series $i_{10}$ arrives at the input $E_{10}$ of the device, the transistor $T_{34}$ conducts so that the charge stored in the capacitance C36 is transferred, via this transistor, to the point $a$. As the capacitance $C_{36}$ is substantially smaller than that of the circuit A, this shift of charge does not substantially modify the value of the potential at the point $a$. As a result, the transistors $T_{33}$ and $T_{36}$ are cut off as voltage $V_c$ goes to zero.

The system is thus again in the condition in which it was upon the arrival of the first pulse of series $i_9$ and the cycle described can therefore start all over again.

As can be seen, the system which has just been described is not limited to forming long periodic signals from two series of short pulses but furthermore effects a binary division of the frequency of these signals, the output signals produced appearing and disappearing once every two pulses received at the inputs $E_9$ and $E_{10}$ of the system.

Figure 9:
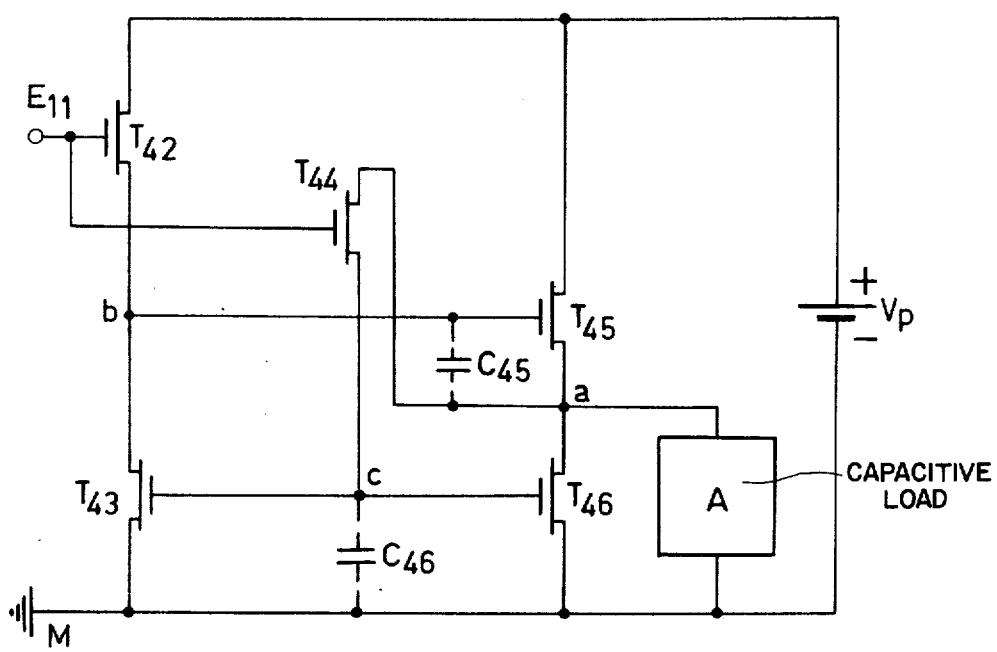
FIG. 9 is a circuit diagram of a fourth embodiment.
Figure 10:
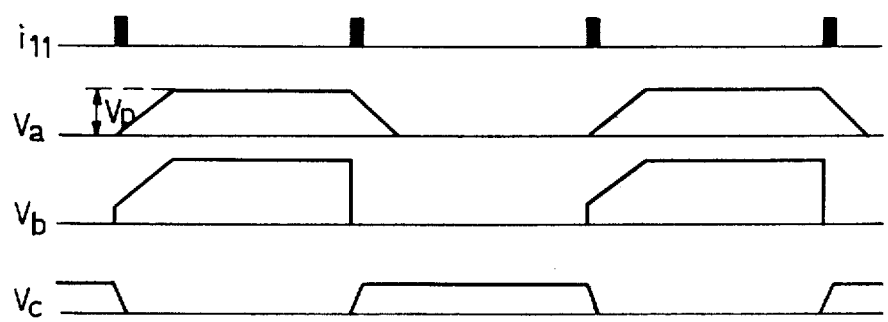
FIG. 10 is a set of graphs relating to the operation of the system of FIG. 9.

The embodiment shown in FIG. 9 is designed to permit energization of a capacitive circuit A by means of a single periodic signal formed by a series of pulses $i_{11}$ (FIG. 10).

This system is structuarlly identical with the embodiment illustrated in FIG. 7 from which it differs only by the fact that the gate of the transistor $T_{44}$ is connected, like that of the transistor $T_{42}$, to a single input terminal $E_{11}$ receiving the pulses $i_{11}$.

The operation of this embodiment will now be described with the assumption that in unput capacitance of the circuit A is discharged and that the capacitance $C_{46}$ is charged, the transistors $T_{43}$ and $T_{46}$ being accordingly conductive.

Upon the arrival at the input $E_{11}$ of the first pulse of the series $i_{11}$, the transistors $T_{42}$ and $T_{44}$ conduct which causes, on the one hand, a transfer of the charge from the terminal c of capacitance $C_{46}$ to the point $a$ through the transistor $T_{44}$, the potential $V_a$ at the point $a$ remaining practically unchanged the resulting cutoff of transistors $T_{43}$ and $T_{46}$, and, on the other hand, the charging of the capacitance $C_{45}$ of the transistor $T_{45}$ and, therefore, the unblocking of this transistor (see curve $V_b$ FIG. 10) and accordingly the rise of the potential $V_a$ to the value of the supply voltage $V_p$ in the manner already described with reference to FIG. 7.

The following pulse arriving at the input $E_{11}$ drives the transistor $T_{44}$ to conduction and, therefore, causes the charging of the capacitance $C_{46}$ through this transistor. When the potential $V_c$ at the point c reaches the value of the threshold voltage of the transistors $T_{43}$ and $T_{46}$, these transistors conduct so that the capacitance $C_{45}$ of the transistor $T_{45}$ and the capacitance of the circuit A discharge through the transistors $T_{43}$ and $T_{46}$, respectively. This same pulse also turns on the transistor $T_{42}$ which does not exert any particular influence since the transistors $T_{43}$ and $T_{46}$ are conductive. The voltage $V_a$ at the point $a$ drops to O. 0.

The divider is now ready for a new operating cycle.

As can be seen, the system which has just been described also effects a binary division of the frequency of the pulses $i_{11}$, the signals appearing at the point $a$ of the device being produced at the rate of one output signal every two trigger pulses $i_{11}$ received at the terminal $E_{11}$ of the device.

The different electronic components of the described system will advantageously be made in integrated form. In this connection, it may be mentioned that although we have shown in the drawing circuits in which the transistors are FETs of the N-channel type, integrated in a P-type crystal body, one can obviously design the same structures with the use of P-channel FETs integrated in an N-type crystal body provided that in this case the battery $V_p$ will be connected to ground by its positive terminal.

Also, our system operates with signals of rather high frequency so that the discharges due, for instance, to the reverse currents of the junctions do not adversely affect its operation.

Moreover, it will be noted that the crystal in which the electronic components of the devices described are integrated can advantageously be biased, for example, by means of a circuit of the type illustrated in Swiss Pat. application No. 9644/72 of June 27, 1972. This, on the one hand, assures better control of the threshold voltage of the integrated transistors and, on the other hand, decreases the value of the parasitic capacitances, particularly the capacitances due to the junctions of the integrated elements.

The invention is not limited to what has been described or shown; in particular, it will be understood that it would be entirely possible to apply the balanced circuitry shown in FIG. 5 to the system illustrated in FIG. 1, as well as to any related system.

We claim:
1. An electronic control system comprising:
   a capacitive load to be energized with a recurrent sustained binary signal;
   a generator of periodic trigger pulses of a duration representing a small fraction of their repetition period;
   a supply of direct current with a positive and a negative pole; and
   a set of field-effect transistors connected between said generator and said load, each of said transistors having a pair of main electrodes and a gate insulated from said main electrodes, said set including a first pair of transistors with main electrodes serially connected across said supply forming a first junction therebetween, a second pair of transistors with main electrodes serially connected across said supply forming a second junction therebetween, and a further transistor, one transistor of said first pair having its gate connected to said generator for periodic energization by said trigger pulses, said one transistor of said first pair having a main electrode connected to one pole of said supply, one transistor of said second pair having its gate connected to said first junction and having a main electrode connected to said one pole, said load being connected to said second junction;
   said one transistor of said second pair having an input capacitance effective between its gate and said second junction which is small compared to the capacitance of said load whereby the potential of said second junction changes substantially more slowly than the potential of said first junction, each transistor of said second pair in its conductive state forming with said load a network of a time constant long enough to make the transition between said levels outlast the duration of said trigger pulses;
   the other transistors of said pairs having main electrodes connected to the other pole of said supply and having their gates interconnected by a third junction, said further transistor being connected with its main electrodes between said second and third junctions for making same conductive between periods of conduction of said one transistor of said first pair due to the trigger pulses applied to the gate thereof, thereby periodically changing the potential of said second junction between a lower and a higher voltage level, and having its gate connected to said generator for triggering thereby after every change in the voltage level of said second junction.

2. An electronic control system comprising:
a capacitive load to be energized with a recurrent sustained binary signal;
a generator of periodic trigger pulses of a duration representing a small fraction of their repetition period;
a supply of direct current with a positive and a negative pole; and
a set of field-effect transistors connected between said generator and said load, each of said transistors having a pair of main electrodes and a gate insulated from said main electrodes, said set including a first, a second and a third pair of transistors each with main electrodes serially connected across said supply, said first, second and third pairs respectively forming a first, a second and a third junction therebetween, the gates of the transistors of said first and third pairs being connected to said generator for periodic energization by said trigger pulses in an invariable order, one transistor of each pair having a main electrode connected to one pole of said supply, the other transistor of each pair having a main electrode connected to the other pole of said supply;
said one transistor of said second pair having its gate connected to said first junction and said other transistor of said second pair having its gate connected to said third junction for periodically changing the potential of said second junction between a lower and a higher voltage level said load being connected to said second junction, said one transistor of said second pair having an input capacitance effective between its gate and said second junction which is small compared to the capacitance of said load whereby the potential of said second junction changes substantially more slowly than the potential of said first junction.

3. A control system as defined in claim 2 wherein said set further includes a fourth pair of transistors with main electrodes serially connected across said supply forming a fourth junction therebetween, one transistor of said fourth pair having a main electrode connected to said one pole and having its gate connected to said third junction, the other transistor of said fourth pair having its gate connected to said first junction, said load having two balanced inputs respectively connected to said second and fourth junctions.

4. An electronic control system comprising:
a capacitive load to be energized with a recurrent sustained binary signal;
a generator of periodic trigger pulses of a duration representing a small fraction of their repetition period;
a supply of direct current with a positive and a negative pole; and
a set of field-effect transistors connected between said generator and said load, each of said transistors having a pair of main electrodes and a gate insulated from said main electrodes, said set including a first pair of transistors with main electrodes serially connected across said supply forming a first junction therebetween, a second pair of transistors with main electrodes serially connected across said supply forming a second junction therebetween, and a further transistor, one transistor of said first pair having its gate connected to said generator for periodic energization by said trigger pulses, said one transistor of said first pair having a main electrode connected to one pole of said supply, one transistor of said second pair having its gate connected to said first junction and having a main electrode connected to said one pole, said load being connected between said second junction and the other pole of said supply;
said one transistor of said second pair having an input capacitance effective between its gate and said second junction which is small compared to the capacitance of said load;
the other transistors of said pairs having main electrodes connected to said other pole and having their gates interconnected by a third junction, said further transistor being connected with its main electrodes between said second and third junctions and having its gate connected to said generator.

5. A control system as defined in claim 4 wherein said generator has a first terminal connected to the gate of said one transistor of said first pair and a second terminal connected to the gate of said further transistor, said trigger pulses forming two interleaved pulse trains alternately appearing on said first and second terminals.

6. A control system as defined in claim 4 wherein said further transistor has its gate connected to the gate of said one transistor of said first pair for joint triggering therewith.

7. An electronic control system comprising:
a capacitive load to be energized with a recurrent sustained binary signal;
a generator of periodic trigger pulses of a duration representing a small fraction of their repetition period;
a supply of direct current with a positive and a negative pole; and
a set of field-effect transistors connected between said generator and said load, each of said transistors having a pair of main electrodes and a gate insulated from said main electrodes, said set including a first, a second and a third pair of transistors each with main electrodes serially connected across said supply, said first, second and third pairs respectively forming a first, a second and a third junction therebetween, the gates of the transistors of said first and third pairs being connected to said generator for periodic energization by said trigger pulses in an invariable order, one transistor of each pair having a main electrode connected to one pole of said supply, the other transistor of each pair having a main electrode connected to the other pole of said supply, said load being connected between said second junction and said other pole;
said one transistor of said second pair having its gate connected to said first junction and said other transistor of said second pair having its gate connected to said third junction, said one transistor of said second pair having an input capacitance effective between its gate and said second junction which is small compared to the capacitance of said load.

8. A control system as defined in claim 7 wherein said generator has a first terminal connected to the gate of said other transistor of said third pair, a second terminal connected to the gate of said one transistor of said first pair, a third terminal connected to the gate of said other transistor of said first pair, and a fourth terminal connected to the gate of said one transistor of said third pair, said trigger pulses forming four interleaved pulse trains consecutively appearing on said first, second, third and fourth terminals.

9. A control system as defined in claim 7 wherein said generator has a first terminal connected to the gate of said one transistor of said first pair and the gate of said other transistor of said third pair, and a second terminal connected to the gates of said other transistors of said first pair and said one transistor of said third pair, said trigger pulses forming two interleaved pulse trains alternately appearing on said first and second terminals.

10. An electronic control system comprising:
- a capacitive load to be energized with a recurrent sustained binary signal;
- a generator of periodic trigger pulses of a duration representing a small fraction of their repetition period;
- a supply of direct current with a positive and a negative pole; and
- a set of field-effect transistors connected between said generator and said load, each of said transistors having a pair of main electrodes and a gate insulated from said main electrodes, said set including a first, a second, a third and a fourth pair of transistors each with main electrodes serially connected across said supply, said first, second, third and fourth pairs respectively forming a first, a second, a third and a fourth junction therebetween, the gates of the transistors of said first and third pairs being connected to said generator for periodic energization by said trigger pulses in an invariable order, one transistor of each pair having a main electrode connected to one pole of said supply, the other transistor of each pair having a main electrode connected to the other pole of said supply, said load having balanced inputs respectively connected to said second and fourth junctions;

said one transistor of said second pair having its gate connected to said first junction and said other transistor of said second pair having its gate connected to said third junction, said one transistor of said second pair having an input capacitance effective between its gate and said second junction which is small compared to the capacitance of said load;

one transistor of said fourth pair having a main electrode connected to said one pole and having its gate connected to said third junction, the other transistor of said fourth pair having its gate connected to said first junction.

* * * * *